US011176447B2

(12) United States Patent
Lei et al.

(10) Patent No.: US 11,176,447 B2
(45) Date of Patent: Nov. 16, 2021

(54) SEMICONDUCTOR DEVICE MODELING USING INPUT PRE-PROCESSING AND TRANSFORMED TARGETS FOR TRAINING A DEEP NEURAL NETWORK

(71) Applicant: Hong Kong Applied Science and Technology Research Institute Company, Limited, Hong Kong (HK)

(72) Inventors: Yuan Lei, Hong Kong (HK); Xiao Huo, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 821 days.

(21) Appl. No.: 16/011,787

(22) Filed: Jun. 19, 2018

(65) Prior Publication Data
US 2019/0385047 A1 Dec. 19, 2019

(51) Int. Cl.
*G06N 3/063* (2006.01)
*G06N 3/08* (2006.01)
*G06N 3/10* (2006.01)

(52) U.S. Cl.
CPC .............. *G06N 3/063* (2013.01); *G06N 3/08* (2013.01); *G06N 3/10* (2013.01)

(58) Field of Classification Search
CPC ........ G06N 3/063; G06N 3/0635; G06N 3/08; G06N 3/10
See application file for complete search history.

(56) References Cited

U.S. PATENT DOCUMENTS 8,533,136 B1  9/2013  Xu et al.
9,026,964 B2  5/2015  Mohanty et al.

FOREIGN PATENT DOCUMENTS

CN  103310285 A  9/2013
CN  103745273 A  4/2014
CN  105138741 A  12/2015
CN  105550425 A  5/2016
(Continued)

OTHER PUBLICATIONS

Zhang, Lining, and Mansun Chan. "Artificial neural network design for compact modeling of generic transistors." Journal of Computational Electronics 16.3 (2017): 825-832. (Year: 2017).*
(Continued)

*Primary Examiner* — Benjamin P Geib
(74) *Attorney, Agent, or Firm* — Stuart T. Auvinen; g Patent LLC (57) ABSTRACT

A deep neural network models semiconductor devices. Measurements of test transistors are gathered into training data including gate and drain voltages and transistor width and length, and target data such as the drain current measured under the input conditions. The training data is converted by an input pre-processor that can apply logarithms of the inputs or perform a Principal Component Analysis (PCA). Rather than use measured drain current as the target when training the deep neural network, a target transformer transforms the drain current into a transformed drain current, such as a derivative of the drain current with respect to gate or drain voltages, or a logarithm of the derivative. Weights in the deep neural network are adjusted during training by comparing the deep neural network's output to the transformed drain current and generating a loss function that is minimized over the training data.

18 Claims, 7 Drawing Sheets

(56) References Cited

FOREIGN PATENT DOCUMENTS

| CN | 106295064 A | 1/2017 |
|---|---|---|
| CN | 106446310 A | 2/2017 |
| CN | 106470023 A | 3/2017 |
| CN | 106777620 A | 5/2017 |

OTHER PUBLICATIONS

Chen, Quan, and Guanhua Chen. "Artificial neural network compact model for TFTs." 2016 7th International Conference on Computer Aided Design for Thin-Film Transistor Technologies (CAD-TFT). IEEE, 2016. (Year: 2016).*

Xu, Jianjun, and David E. Root. "Advances in artificial neural network models of active devices." 2015 IEEE MTT-S International Conference on Numerical Electromagnetic and Multiphysics Modeling and Optimization (NEMO). IEEE, 2015. (Year: 2015).*

ISR and Written Opinion, PCT/CN2018/092038, dated Mar. 18, 2019.

Root, D.E., "Future device modeling trends", IEEE Microw. Mag., 2012, pp. 45-59.

Jianjun Xu and D. E. Root, "Advances in artificial neural network models of active devices", Proc. IEEE MTT-S Int. Conf. Numer. Electromagn. Multiphys. Modeling Optim. (NEMO), Aug. 2015, pp. 13-15.

H. B. Hammouda, M. Mhiri, Z. Gafsi, and K. Besbes, "Neural-based models of semiconductor devices for SPICE simulator," Amer. J. Appl. Sci., vol. 5, No. 4, 2008, pp. 385-391.

Lingling Sun. et al. , "Large-signal Modeling of HEMT Device based on Neural Network", 3rd Int'l Conf Microwave and Millimeter Wave Technology Proceedings, 2002, pp. 883-886.

Mingda Li et al, "Physics-Inspired Neural Networks for Efficient Device Compact Modeling", IEEE Journal on Exploratory Solid-State Computational Devices and Circuits, vol. 2, 2006, pp. 44-49.

* cited by examiner

SEMICONDUCTOR DEVICE MODELING USING INPUT PRE-PROCESSING AND TRANSFORMED TARGETS FOR TRAINING A DEEP NEURAL NETWORK

FIELD OF THE INVENTION

This invention relates to semiconductor device modeling, and more particularly to using artificial neural networks to model devices.

BACKGROUND OF THE INVENTION

A single Integrated Circuit (IC) may contain a million transistors. Each transistor is typically a Metal-Oxide-Semiconductor Field-Effect Transistor (MOSFET) or variant that is formed on a semiconductor substrate. During IC design a net list or schematic is created that details the connections between these transistors and any other components such as capacitors and resistors. The net list can then be simulated using a circuit simulator that uses a device model to simulate the operation of each of the transistors.

The device model estimates the electrical characteristics of the transistor, such as the drain current as a function of the gate and drain voltages. More precise simulation can use more precise models that estimate other parameters such as parasitic capacitances to better estimate delays and circuit timings.

One important simulator is the Simulation Program for Integrated Circuit Emphasis (SPICE), originally developed by the University of California at Berkeley in 1975. SPICE has been extended and enhanced since then with many variants. Berkeley Short-Channel IGFET Model (BSIM) is another model that is especially useful for modeling smaller transistor devices.

Test circuits such as transistors with test pads that could be manually probed were added to IC's, allowing device engineers to manually probe and test these devices to measure currents as a function of voltages. Using these test results, device engineers could determine device parameters for use with SPICE or BSIM device models, and these parameters were used for simulating larger IC's. These manual measurements were replaced by automated measurements, but extracting device parameters for use with the SPICE or BSIM models was still time-consuming.

As device sizes shrunk, the basic first-order device models failed to accurately estimate currents for the smaller devices. Second-order effects caused by short channel lengths, buried layers, and sub-micron geometries required new parameters and more complex device modeling equations. More test devices having varying sizes and shapes were added and tested to obtain values for these additional parameters. Automated measurement equipment allowed device model parameters to be extracted more quickly.

As device sizes continued to shrink, devices having gate lengths of only 10 nanometers or less presented additional challenges to device modeling as device sizes neared the size of atoms in the semiconductor substrate. New semiconductor materials were being used, such as Gallium Nitride (GaN), Gallium Arsinide (GaAs), and Silicon Carbide (SiC), with physical properties that varied from that of silicon. Exotic devices such as Fin Field-Effect Transistor (FinFET) and Silicon-On-Insulator (SOI) had three-dimensional current flows that could not be accurately modeled using older two-dimensional current-flow models. Measuring the actual currents for test devices of varying sizes and shapes became critical to creating usable device models.

More recently, Artificial Neural Networks (ANN) are being used to generate device models and to select parameters. Artificial Neural Networks are especially useful for processing large amounts of data in complex ways that are hard to define using traditional computer programs. Instead of being programmed with instructions, training data is input to a neural network and compared to the expected output, then adjustments are made within the neural network and the training data is again processed and outputs compared to generate further adjustments to the neural network. After many such training cycles, the neural network is altered to efficiently process data similar to the training data and expected outputs. Neural networks are an example of machine learning, since the neural network learns how to generate the expected outputs for the training data. Real data similar to the training data can then be input to the neural network to process live data.

Figure 1:
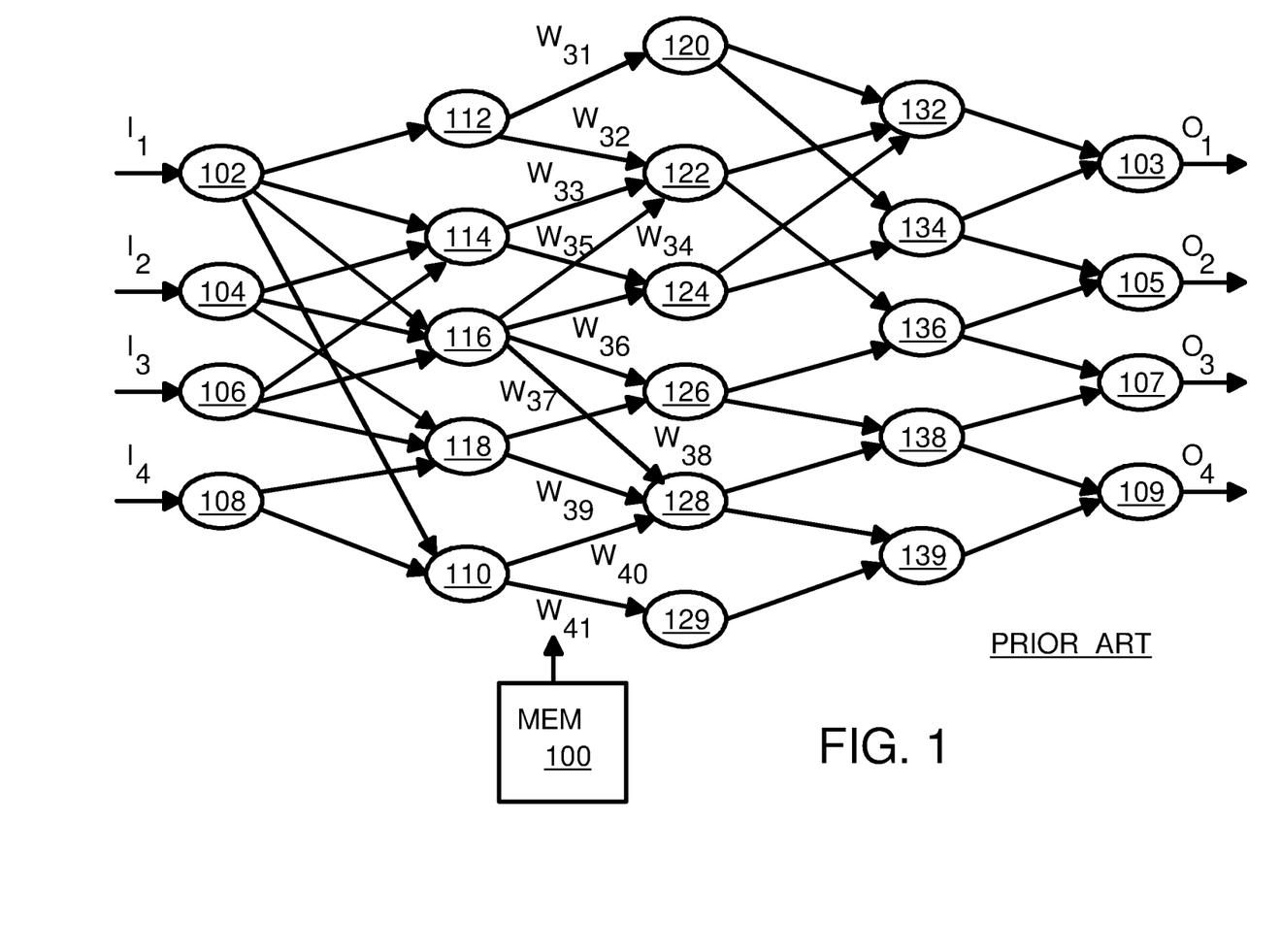
FIG. 1 illustrates a prior art neural network.

FIG. 1 illustrates a prior art neural network. Input nodes 102, 104, 106, 108 receive input data $I_1, I_2, I_3, \ldots I_4$, while output nodes 103, 105, 107, 109 output the result of the neural network's operations, output data $O_1, O_2, O_3, \ldots O_4$. Three layers of operations are performed within this neural network. Nodes 110, 112, 114, 116, 118, each take inputs from one or more of input nodes 102, 104, 106, 108, perform some operation, such as addition, subtraction, multiplication, or more complex operations, and send and output to nodes in the second layer. Second-layer nodes 120, 122, 124, 126, 128, 129 also receive multiple inputs, combines these inputs to generate an output, and sends the outputs on to third-level nodes 132, 134, 136, 138, 139, which similarly combine inputs and generate outputs.

The inputs at each level are typically weighted, so weighted sums (or other weighted operation results) are generated at each node. Each input at a node can be assigned a weight that is multiplied by that input before all the weighted inputs are summed, multiplied together, or otherwise operated upon by the node to generate the node's outputs. These weights can be designated $W_{31}$, $W_{32}$, $W_{32}$, $W_{33}, \ldots W_{41}$, etc., and have their values adjusted during training. Through trial and error or other training routines, eventually higher weights can be given for paths that generate the expected outputs, while smaller weights assigned to paths that do not generate the expected outputs. The machine learns which paths generate the expected outputs and assigns high weights to inputs along these paths.

These weights can be stored in weights memory 100. Since neural networks often have many nodes, there may be many weights to store in weights memory 100. Each weight may require multiple binary bits to represent a range of possible values for that weight. Weights often require 8 to 16 bits.

Figure 2:
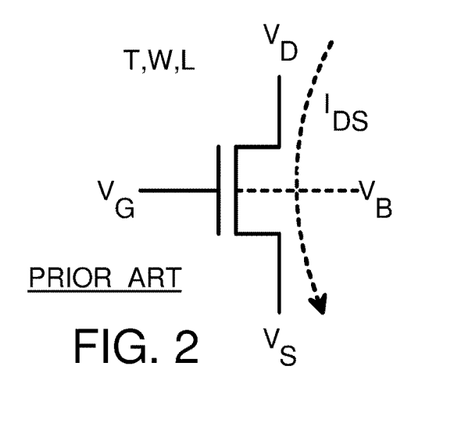
FIG. 2 highlights a transistor device model.

FIG. 2 highlights a transistor device model. A gate voltage Vg and a drain voltage Vd are applied to a transistor, while the source voltage Vs is typically grounded. The substrate or bulk voltage Vb can be grounded or another voltage such as a back-bias. A device model uses various parameters to predict the drain current Id that is produced as a function of Vg, Vd, Vb, Vs. Other inputs such as the temperature T, the gate width W and the gate length L also can affect the predicted drain current, especially when L is very small.

Figure 3:
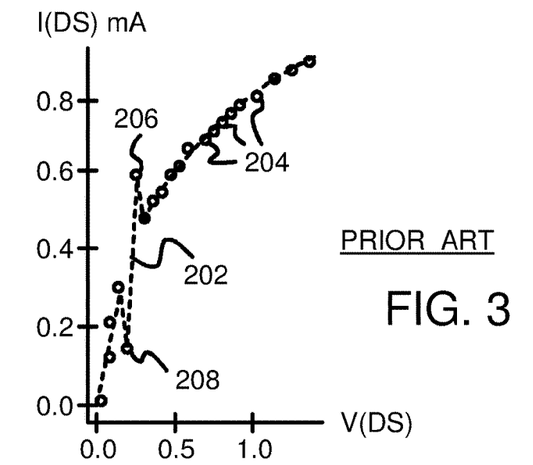
FIG. 3 shows an over-fitting problem when modeling a device.

FIG. 3 shows an over-fitting problem when modeling a device. Measured data 204, 206, 208 is input into a neural network to generate model parameters that best fit the measured data 204, 206, 208. Modeled current 202 is a best-fit model of the measured data 204, 206, 208. Measured data 206, 208 are two exceptional data points that may be the result of some kind or measurement error. Using a neural network to fit all the data points, including exceptional measured data 206, 208, results in modeled current 202 spiking down to exceptional measured data 208, then up sharply to exceptional data point 206, before falling back down to measured data 204. Exceptional measured data 206, 208 causes modeled current 202 to have a negative conductance around the exceptional data points. Also, modeled current 202 that is beyond measured data 204 can be unreliable and prone to erratic behavior. Scalability is poor.

Figure 4A:
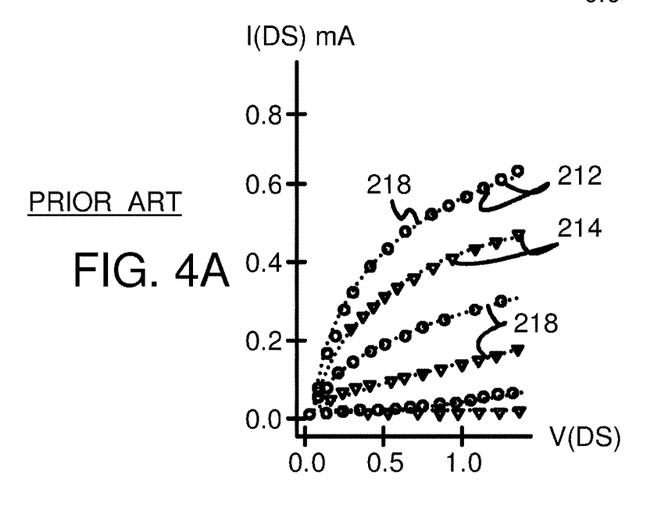
FIGS. 4A-4B show poor modeling as lower limits are reached.
Figure 4B:
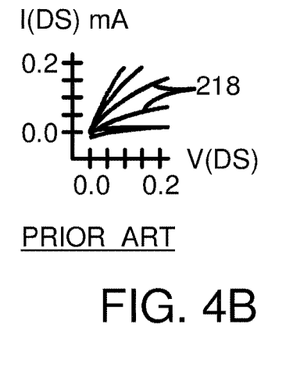

FIGS. 4A-4B show poor modeling as lower limits are reached. In FIG. 4A, measurements of drain current as a function of drain-to-source voltage is plotted. Training data 214 and test data 212 are measured data points, but training data 214 is input to the neural network to generate weights while test data 212 is used to test the accuracy of the neural network weights. Model 218 is generated for difference values of the gate voltage Vg. While the accuracy of model 218 appears good for the larger currents in FIG. 4A, the accuracy of model 218 for the smaller currents of FIG. 4B is poor. Rather than converge at the origin (0,0), the lines of model 218 diverge near the origin. Model 218 fails for sub-threshold voltages and currents.

Figure 5:
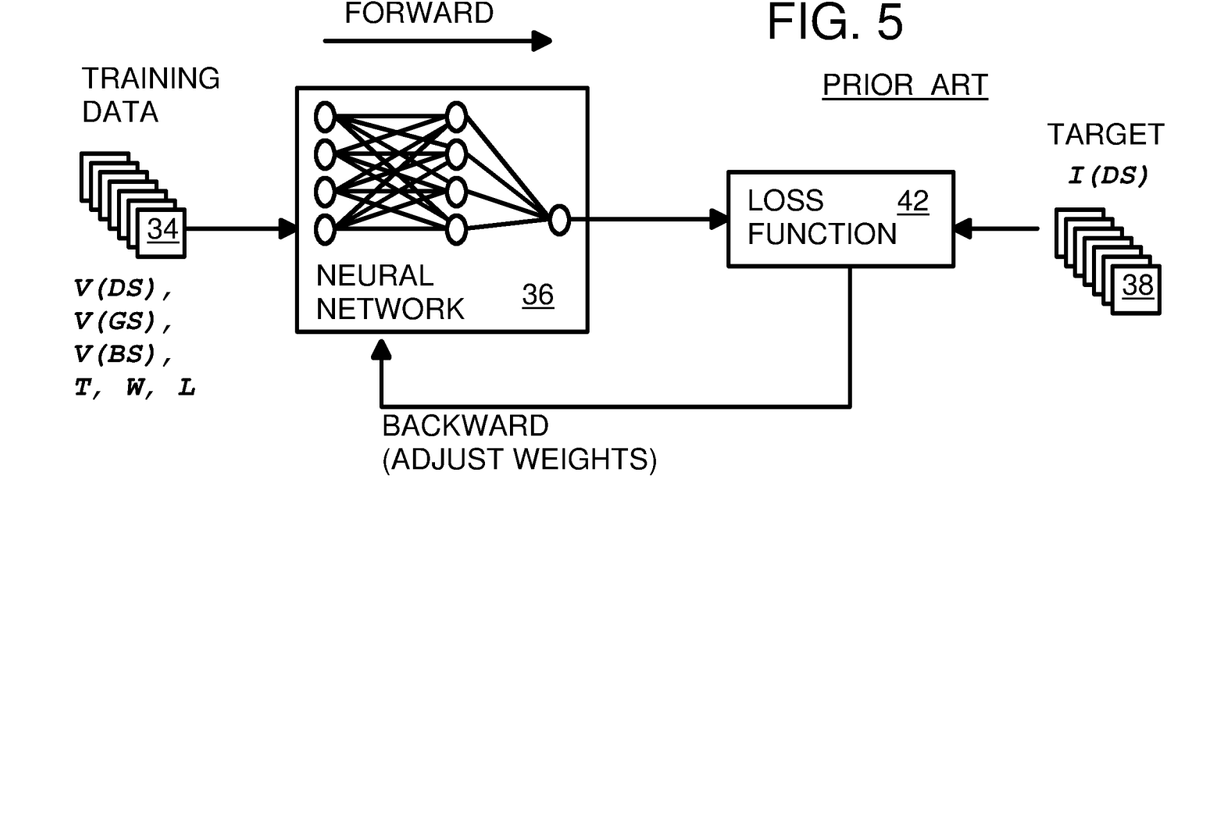
FIG. 5 shows training a neural network using drain current as the target to generate a device model.

FIG. 5 shows training a neural network using drain current as the target to generate a device model. Measurements of test transistors are made and the input voltage, temperature, channel width W and channel length L are recorded as training data 34, and the resulting drain current Ids is recorded as target data 38 that corresponds with that combination of input data. Neural network 36 receives training data 34 and a current set of weights, and operates on training data 34 to generate a result. The generated result from neural network 36 is compared to target data 38 by loss function 42, which generates a loss value that is a function of how far the generated result is from the target. The loss value generated by loss function 42 is used to adjust the weights applied to neural network 36. Many iterations of weights may be applied by loss function 42 onto training data 34 until a minimum loss value is identified, and the final set of weights used to model the transistor.

Having a device model that is accurate over a wide range, from sub-threshold to strong inversion, is desirable. However, using neural networks can cause the over-fitting problem of FIG. 3, and the sub-threshold problem of FIG. 4B. Additionally, derivatives or slopes of the models, such as conductance (Gds) and transconductance (Gm), are used by some circuit simulators, but model convergence problems may distort conductance (Gds) and transconductance (Gm) values that are extracted. The model's first-order derivative may have poor accuracy. Monotonicity may be poor. In order to avoid overfitting and bad monotonicity problems, the hidden layer size may need to be limited, which makes the use of deep neural networks difficult. However, shallow neural networks cannot be applied to more complex models and still get precise modeling.

What is desired is a device model for a semiconductor Integrated Circuit (IC) that accurately models currents over a wide range, including the sub-threshold region. A device model generated by a neural network is desired, but that does not have an over-fitting problem. A device model that accurately models conductance (Gds) and transconductance (Gm) values is desirable.

DETAILED DESCRIPTION

The present invention relates to an improvement in semiconductor device modeling using Artificial Neural Networks. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 6:
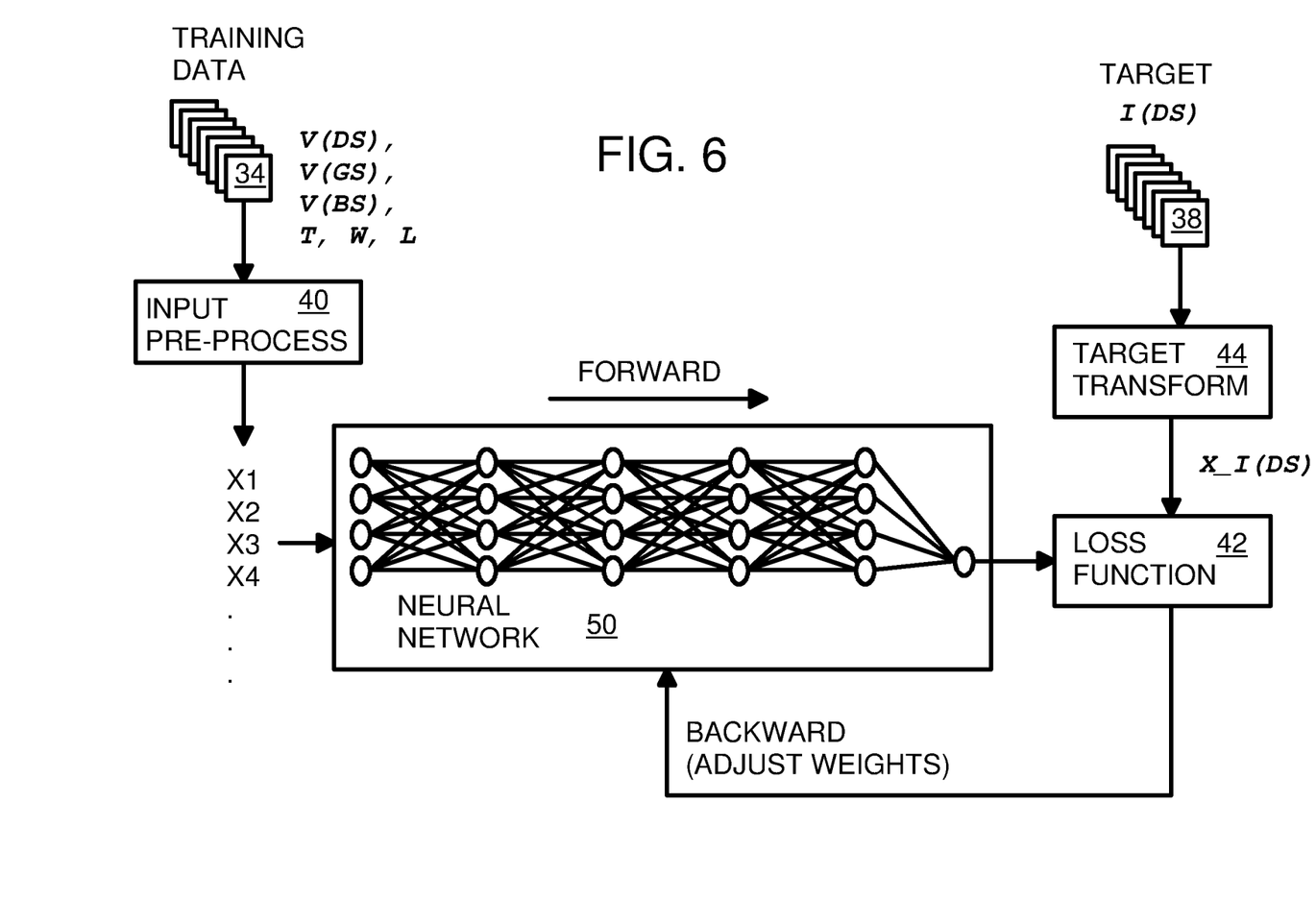
FIG. 6 is a diagram of an Artificial Neural Network that targets a transform of the semiconductor drain current.

FIG. 6 is a diagram of an Artificial Neural Network that targets a transform of the semiconductor drain current. While drain current is approximately linear over some regions of operation, drain current is quite non-linear over wider ranges of operating conditions that may occur. The inventors realize that, contrary to first-order models that are commonly used to visualize transistor operation, drain current is non-linear. The inventors believe that using drain current as the target of neural network optimization inherently leads to model accuracy problems of subthreshold currents, over-fitting, poor monotonicity, and convergence.

The inventors have discovered that transforming the target allows for better model generation and accuracy of the resulting models. Rather than use drain current Ids as the target, the drain current is transformed, and the transformed drain current is used by loss function 42 to generate the loss function and to adjust weights.

The measured drain current in target data 38 is transformed by target transformer 44 into transformed drain current X_Ids. Target transformer 44 may transform drain current by generating a derivative of the drain current. The derivative may be with respect to the gate, drain, or bulk input voltages, transistor size, temperature, etc. A logarithm of this derivative may also be used as the transformed drain current. Loss function 42 calculates the difference between the neural-network output and its expected output, which is the transformed drain current X_Ids. The weights applied to deep neural network 50 are adjusted by some optimized algorithm, such as a stochastic gradient descent algorithm, to make the difference calculated by loss function 42 smaller and smaller. The difference between the transformed drain current and the neural network output calculated by loss function 42 can be a smaller loss than the loss between the drain current and the neural network output.

Training data 34 includes the combinations of drain-to-source voltage Vds, gate-to-source voltage Vgs, bulk-to-source voltage Vbs, temperature, transistor channel width W and length L that generate a measured drain-to-source current Ids. These input voltages and conditions are processed by input pre-processor 40 to generate pre-processed input data that is applied as inputs to deep neural network 50.

Input pre-processor 40 can perform various pre-processing on training data 34, such as obtaining the natural logarithm of input voltages −ln(Vgs), ln(Vgs). Principal Component Analysis (PCA) may be performed by input pre-processor 40 operating on training data 34 to obtain the principal variables that most strongly impact the transform of the drain current. PCA detects which input variables most strongly impact the drain current. PCA may use the eigenvector of the covariance matrix to reduce the variable dimensions.

Deep neural network 50 can be a neural network generated by engineers for a particular application, or a generic neural network that is adjusted for a particular application. For example, the number of intermediate or hidden layers in the neural network may be adjusted for a particular application, and the type of operations performed in nodes and the connectivity among nodes may be adjusted for certain applications or problems to be solved, such as modeling semiconductor devices. While shallow neural networks are often used for modeling drain current Ids, a deep neural network with at least 5 layers is used for deep neural network 50. Having more layers in deep neural network 50 allows for better modeling of second order effects such as buried layers in the semiconductor device and three-dimensional current flow in complex devices.

The initial weights used in deep neural network 50 may be set to random values within an initial range such as (−1.0 to 1.0). Training data 34 is pre-processed by input pre-processor 40 and input to deep neural network 50 when training routines are executed, allowing the output of deep neural network 50 to be evaluated.

One method to evaluate the quality of the output of deep neural network 50 is to compute costs. Loss function 42 can generate an accuracy cost that is a measure of how close to the expected results the current cycle's output is. A Mean Square Error (MSE) may be generated by squaring the individual output differences with the expected value for that output, and averaging or summing these squares for all outputs.

The goal of training is to find the values of the weights which can make the network output (predicted value) be the same as or closed to a fitting target (data). This process is complicated so it is impossible to use a mathematical method to calculate weights. But a computer can learn from the data. After pre-processing or transforming, the data is separated into inputs and targets. First the weights are set to random initial values. When an input vector is presented to the neural network, the value is propagated forward through the neural network, layer by layer, until it reaches the output layer. The output of the neural network is then compared to the target, using a loss function. The loss function of a single output is $\frac{1}{2}|y-y'|^2$, where y is the neural network output and y' is the target. The loss function E over n inputs of data is an average of losses over individual inputs: $E=\frac{1}{2}n*\Sigma|y-y'|^2$. After the losses of n inputs are determined, an optimization algorithm can be used to adjust weights and minimize the loss. The optimization algorithm repeats this two phase cycle, forward calculation (propagation) and weights update. Forward calculation is used to calculate the total losses. In the second phase, optimization methods, such as gradient descent, is used to update the weights in an attempt to minimize the loss. When the total loss is decreased below an acceptable value, these cycles are stopped.

The loss function generated by loss function 42 may also include a complexity cost that includes a weight decay function to prevent over-fitting when adjusting weight ranges, and a sparsity function to improve the structure and regularity within deep neural network 50. The complexity cost can prevent the model from over-fitting, such as to include exceptional measured data 206, 208 (FIG. 3), since the complexity of the model increases to include exceptional measured data 206, 208 compared with the model with a smoother line that excludes exceptional measured data 206, 208.

The accuracy cost and the complexity cost may both be generated as part of loss function 42 and used to adjust the weights for the next cycle of training by training routines. The updated weights are applied to deep neural network 50 and training data 34 pre-processed by input pre-processor 40 are again input to deep neural network 50, which generates a new set of results that has its costs generated by loss function 42 by comparison to the transformed drain currents. Many cycles of adjusting weights and re-calculating costs are performed until a desired endpoint is reached. Then the final weights applied to deep neural network 50 can be used to construct the final device model.

Figure 7:
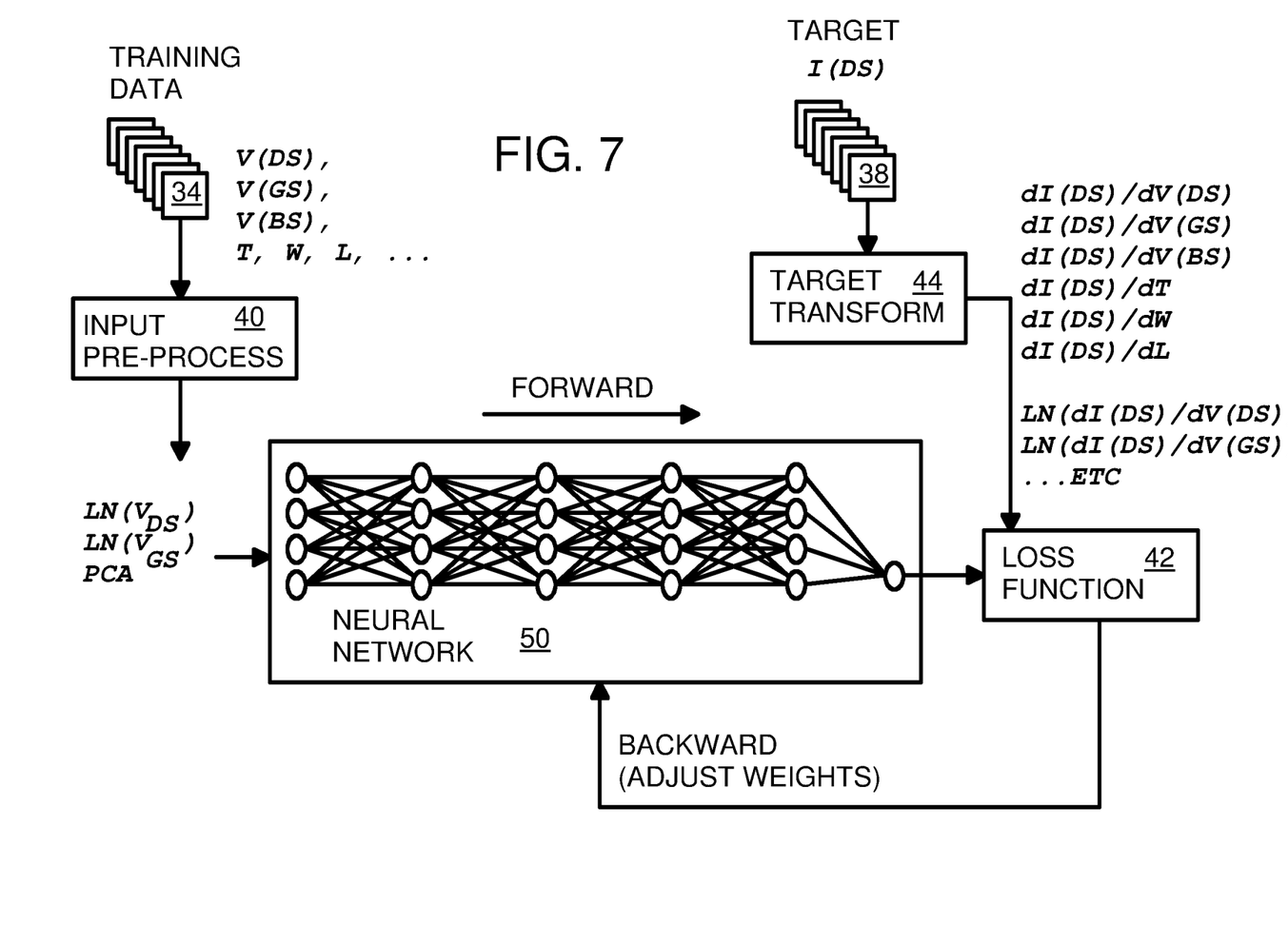
FIG. 7 shows a deep neural network operating upon pre-processed inputs and adjusting weights using a loss function for transformed targets.

FIG. 7 shows a deep neural network operating upon pre-processed inputs and adjusting weights using a loss function for transformed targets. Measured inputs conditions such as gate, drain, bulk voltages, temperature, and transistor sizes are input as training data 34. Input pre-processor 40 processes training data 34 to generate pre-processed inputs to deep neural network 50. These pre-processed inputs can include the logarithm of the drain-to-source voltage, the logarithm of the gate-to-source voltage, and other inputs that are selected or combined by Principal Component Analysis (PCA).

Deep neural network 50 operates on the pre-processed inputs from input pre-processor 40, using a set of weights that are adjusted by an optimization algorithm with loss function 42. Deep neural network 50 can be operated in the forward direction, where each set of pre-processed inputs is operated upon by each node within deep neural network 50 that has a weight between −1 and 1, to generate one or more outputs that are analyzed by loss function 42 to generate a new set of weights. The new set of weights are sent in a backwards direction to deep neural network 50, causing the outputs of deep neural network 50 to change in response to the adjusted weights, when the inputs remain constant.

Loss function 42 does not compare the expected output to the measured drain current. Instead, the measured drain currents in target data 38 are transformed by target transformer 44 to generate transformed drain currents. The transformed drain currents are compared to the neural network output by loss function 42.

As FIG. 7 shows, the transformed drain current generated by target transformer 44 and compared to the output of deep neural network 50 by loss function 42 can be a derivative of the drain current. Theses transformations of the drain current may include the derivative of the drain current with respect to the drain-to-source voltage, d(Ids)/d(Vds), the derivative of the drain current with respect to the gate-to-source voltage, d(Ids)/d(Vgs), the derivative of the drain current with respect to the bulk-to-source voltage, d(Ids)/d(Vbs), the derivative of the drain current with respect to temperature, d(Ids)/dT, the derivative of the drain current with respect to the transistor channel length, d(Ids)/dL, and the derivative of the drain current with respect to the transistor channel width, d(Ids)/dW.

The logarithm of any of these derivatives may also be generated by target transformer 44 to be used as the transform of the drain current. For example, the natural logarithm of the derivative of the drain current with respect to the drain-to-source voltage, ln [d(Ids)/d(Vds)], the logarithm of the derivative of the drain current with respect to the gate-to-source voltage, ln [d(Ids)/d(Vgs)], etc.

Using deep neural network 50 with more layers (deeper) allows for more precise modeling of many factors that can occur with sub 10-nm transistors and three-dimensional transistors such as Fin Field-Effect Transistor (FinFET) and Silicon-On-Insulator (SOI). Deep neural network 50 provides a framework for modeling future semiconductor processes that are even more complex.

Figure 8:
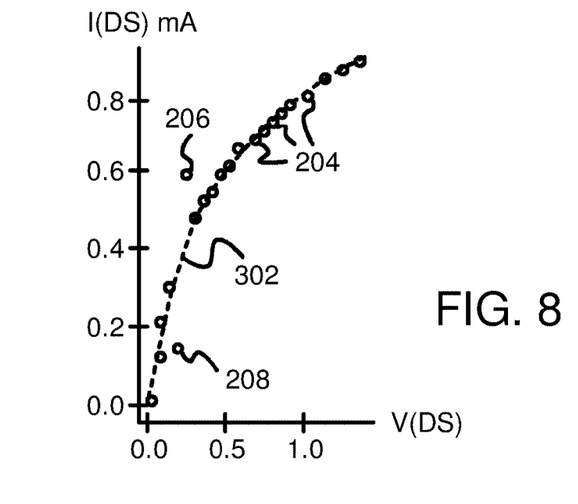
FIG. 8 shows that using transformed drain current as a target for the deep neural network solves the over-fitting problem when modeling the device.

FIG. 8 shows that using transformed drain current as a target for the deep neural network solves the over-fitting problem when modeling the device. Measured data 204, 206, 208 are pre-processed by input pre-processor 40 and input into deep neural network 50 and compared by loss function 42 to the transformed drain currents to generate model parameters that best fit the measured data 204, 206, 208. Modeled current 302 is a best-fit model of the measured data 204, 206, 208.

Measured data 206, 208 are two exceptional data points that may be the result of some kind or measurement error. The value of the drain current at the data points for measured data 206, 208 is not significantly different from the drain current for other measured data 204. However, taking the derivative of the drain current increases the errors generated by loss function 42. While the y values of the data points do not have much difference, the slope of the line connecting the data points has a sharp jump near the poorly-fitting points for measured data 206, 208 (See FIG. 3 line 202). Thus transforming the drain current enlarges the errors generated by loss function 42. A regularization routine may not be able to detect the small errors in drain current, but can detect the enlarged errors in the derivative of the drain current.

A smooth curve for model 302 occurs despite exceptional measured data 206, 208. There is no negative conductance around the exceptional data points. Also, modeled current 302 that is beyond measured data 204 is reliable. Scalability is good.

Figure 9A:
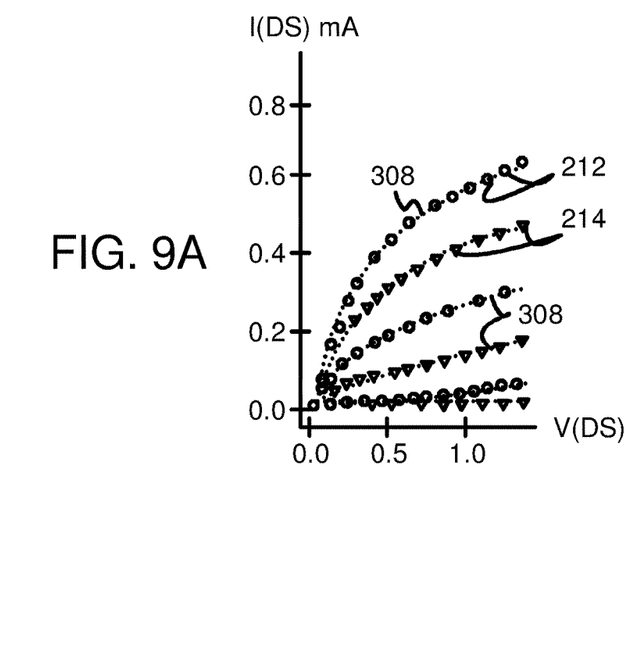
FIGS. 9A-9B show that using transformed drain current as the target allows the deep neural network to better model sub-threshold conditions near the origin.
Figure 9B:
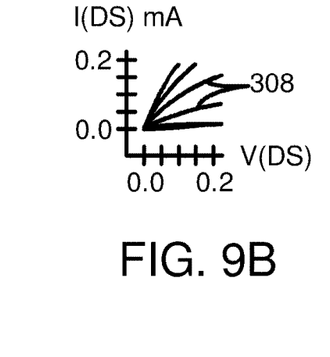

FIGS. 9A-9B show that using transformed drain current as the target allows the deep neural network to better model sub-threshold conditions near the origin. In FIG. 9A, 212

In FIG. 9A, measurements of drain current as a function of drain-to-source voltage is plotted. Training data 214 and test data 212 are measured data points, but training data 214 is pre-processed and input to deep neural network 50 to generate weights while test data 212 is transformed by target transformer 44 and used to test the accuracy of the neural network weights.

Model 308 is generated for difference values of the gate voltage Vg. The accuracy of model 308 is good for the larger currents in FIG. 9A, and the accuracy of model 308 for the smaller currents of FIG. 9B is also good. The lines of model 308 converge at the origin (0,0). Model 308 is good for sub-threshold voltages and currents.

By targeting the transformed drain current, rather than the drain current itself, model 308 can be derived that encompasses a wider range of input voltages. The sub-threshold region can be better modeled so that it converges at the origin.

Figure 10:
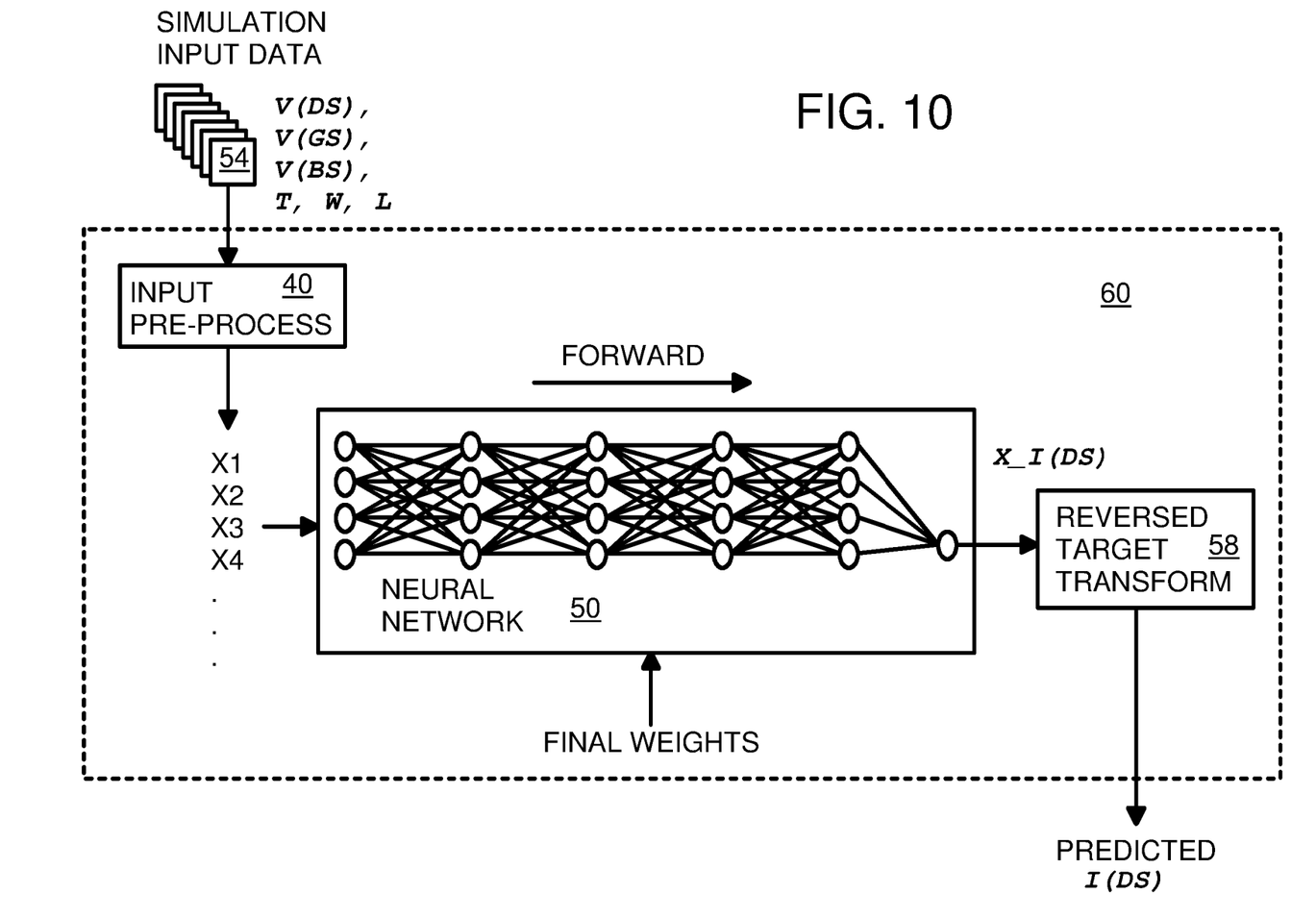
FIG. 10 shows a transistor simulator based on the models and parameters obtained by the deep neural network operating on pre-processed inputs and targeting transformed drain current.

FIG. 10 shows a transistor simulator based on the models and parameters obtained by the deep neural network operating on pre-processed inputs and targeting transformed drain current. After deep neural network 50 has been used to obtain a set of weights that best models the transformed drain current, these final weights can be applied to deep neural network 50. Simulation input data 54 includes the voltages, temperature, and transistor width and length that are input by a design engineer during the circuit design process. Simulation input data 54 are operated upon by input pre-processor 40 to pre-process the input data to obtain pre-processed inputs X1, X2, X3, X4, . . . For example, the logarithms of the gate and drain voltages can be obtained by input pre-processor 40 and input to deep neural network 50.

Deep neural network 50 generates a transformed drain current X_Ids in response to the pre-processed inputs and the final weights. Reversed target transformer 58 performs an operation that is the reverse of the transformation performed by target transformer 44 (FIG. 6). For example, reversed target transformer 58 can integrate the transformed drain current over the gate voltage when target transformer 44 generated a derivative of the drain current with respect to the gate voltage.

Reversed target transformer 58 could integrate using a Riemann sum, Newton-Cotes formulas, or using linear interpolation or polynomial interpolation. An exponential function on the transformed drain current can be generated by reversed target transformer 58 before integration when target transformer 44 performed a logarithm of a derivative of the drain voltage. Reversed target transformer 58 produces a value of the drain current before transformation by target transformer 44. This is the simulated drain current predicted by simulator 60.

During simulation, loss function 42 and target transformer 44 are not needed, since the final weights remain constant and are not adjusted. Simulator 60 can be constructed from input pre-processor 40, deep neural network 50, and reversed target transformer 58. Deep neural network 50 can be reduced in size, such as by deleting nodes that receive a zero-value weight for the final weights. Deep neural network 50 can be a feed-forward neural network when used inside simulator 60. The SPICE, BSIM, or other device model can be replaced with simulator 60 within the larger circuit simulator. For each transistor being simulated, this larger circuit simulator would generate the input voltages, lookup the transistor W and L, read the simulation's specified temperature, and then call simulator 60 to simulate the drain current for that transistor.

The development period and required manpower to generate a usable device model can be significantly reduced by using deep neural network 50 with target transformer 44 and input pre-processor 40. Measurements may be taken from test devices on a test chip manufactured with a new process, and these measurements used as training data 34 (Vgs, Vds, . . . ) and target data 38 (Ids). Deep neural network 50 can be operated forwards and backwards to adjust weights until loss function 42 finds an acceptably low loss or a minimum. Then the final weights can be applied to deep neural network 50 and used with loss function 42 and reversed target transformer 58 to simulate transistors manufactured by the new process.

Alternate Embodiments

Several other embodiments are contemplated by the inventors. For example, target transformer 44, input pre-processor 40, and reversed target transformer 58 could share the same computational hardware, or each could have dedicated hardware. The transformed drain current could be derivatives of the drain current, logarithms of these derivatives, the conductance g(ds), transconductance g(m), the logarithm of conductance or transconductance, or other transforms of the drain current. Several of these transforms could be tested to find a best transform to use as the target generating the lowest loss function. Likewise, input pre-processor 40 can pre-process some or all of the inputs in various ways. Logarithms could be natural logarithms or base-10 logarithms or use some other base. Various combinations of transforms or pre-processing functions may also be substituted.

Some embodiments may not use all components. Additional components may be added. Loss function 42 may use various error/loss and cost generators, such as a weight decay term that prevents weights from growing too large over many cycles of training optimization, a sparsity penalty that encourages nodes to zero their weights, so that only a small fraction of total nodes are effectively in use. The remaining small fraction of nodes is the most relevant. While various loss and cost functions have been described in the theory of operation, many substitutions, combinations, and variations are possible. Other variations and kinds of loss or cost terms can be added to loss function 42. The values of the relative scaling factors for the different cost functions can be adjusted to balance the impact of the various functions.

Floating-point values can be converted to fixed-point values or to binary values. While binary-value weights have been shown, various encodings could be used, such as two's complement, Huffman coding, truncated binary encoding, etc. The number of binary bits required to represent a weight value may refer to the number of bits regardless of the encoding method, whether binary encoding, gray-code encoding, fixed-point, offset, etc.

Weights may be limited to a range of values. While a range of −1 to 1 has been described, the range does not necessarily have to include 0, such as a range of 512 to 1. The weight's value may be offset to fit within a binary range, such as a weight having a range of 10511 to 10000, which could be stored as a 9-bit binary word, with an offset of 10000 added to the binary word to generate the actual weight value. Ranges may be adjusted during optimization. The offset may be stored or may be hardwired into the logic of deep neural network 50.

Many variations are possible for training routines that operate deep neural network 50. Optimization may first determine a number of hidden or intermediate levels of nodes, then proceed to optimize weights. The weights may determine an arrangement or connectivity of nodes by zeroing some weights to cut links between nodes. The sparsity cost may be used for initial cycles of optimization when structure is optimized, but not for later cycles of optimization when weight values are being fine-tuned. A sigmoid function may be used for training hidden layers within deep neural network 50. Lookup tables may be used to implement complex functions rather than an Arithmetic-Logic-Unit (ALU) to speed up processing. An activation function of each node may be different, for example sigmoid, tanh, and relu.

Different amounts of cost reduction may occur for different applications and training sets. A wide variety of structures while different numbers and arrangements of hidden layers may be used for deep neural network 50. The particular application and semiconductor process being modeled may suggest certain kinds of neural networks or arrangements for deep neural network 50 or a generic deep neural network 50 may serve as the starting point. Deep neural network 50 may have at least 7 intermediate layers and have at least ten thousand weights.

Autoencoders, automax and softmax classifiers, and other kinds of layers may be inserted into the neural network. The entire optimization process may be repeated several times, such as for different initial conditions, such as for different number of bits to quantize floating point values or other parameters, different precisions, different scaling factors, etc. The endpoint may be set for various combinations of conditions, such as a desired final accuracy, an accuracy-hardware cost product, a target hardware cost, etc.

While the actual cost of deep neural network 50 depends on many factors, such as the number of nodes, weights, interconnection, control, and interfaces, the inventors approximate the cost as being proportional to the aggregate of the weights. The total number of binary bits used to represent all weights in deep neural network 50 is a measure of the hardware cost, even if only an approximation. Gradients or slopes of the hardware complexity cost gradients may be used. Gradient values may be scaled and otherwise altered before or after comparison.

Many variations of IC semiconductor manufacturing processes are possible. Photomasks may be made with a variety of specialty machines and processes, including direct writing to burn off a metalized layer rather than a photoresist. Many combinations of diffusions, oxide growth, etching, deposition, ion implant, and other manufacturing steps may have their resulting patterns created on the IC controlled by the photomasks. While modeling transistors has been described, and modeling drain current in particular, other currents such as diode currents, substrate leakage currents, etc., could be modeled, and for other devices such as capacitors, resistors, etc.

Deep neural network 50, loss function 42, target transformer 44, reversed target transformer 58, and other components may be implemented in a variety of technologies, using various combinations of software, hardware, firmware, routines, modules, functions, etc. The final product, deep neural network 50 with the final weights, and input pre-processor 40 and reversed target transformer 58, can be implemented in an Application-Specific Integrated Circuit (ASIC) or other hardware to increase processing speed and lower power consumption when simulator 60 is being used to simulate large circuits.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A semiconductor device modeling system comprising:
a deep neural network having a plurality of nodes, each node scaling node inputs using weights to generate node outputs to other nodes in the plurality of nodes;
an input for receiving training data that represents a gate voltage and a drain voltage applied to a transistor, the training data also including a transistor width and a transistor length for the transistor;
an input pre-processor that receives the training data from the input, the input pre-processor converting the training data into pre-processed training data;
wherein the pre-processed training data is applied to inputs of the deep neural network;
a target input that receives target data that represents a drain current of the transistor measured when the gate voltage and the drain voltage represented by the training data is applied to the transistor having the transistor width and the transistor length represented by the training data;
a target transformer that receives the training data from the target input, the target transformer transforming the target data that represents the drain current into a transformed drain current value; and
a loss function generator that compares the transformed drain current value generated by the target transformer to an output generated by the deep neural network in response to the pre-processed training data and using the weights, wherein the loss function generator adjusts the weights to minimize a loss function between the transformed drain current value and the output generated by the deep neural network;
wherein a plurality of the training data and a plurality of the target data is input and processed during training of the deep neural network to generate a plurality of the weights and toss function values;
wherein alter training is completed, a final set of the weights is selected that generated a minimum of the loss function values;
wherein the final set of the weights specifies a device model of the transistor using the deep neural network for simulation;
wherein the target transformer converts the training data that represents the drain current into a derivative of the drain current;
wherein the derivative of the drain current is the transformed drain current value that is also a training target of the deep neural network that is evaluated by the loss function generator.

2. The semiconductor device modeling system of claim 1 wherein the derivative of the drain current is a derivative with respect to the gate voltage.

3. The semiconductor device modeling system of claim 1 wherein the derivative of the drain current is a derivative with respect to the drain voltage.

4. The semiconductor device modeling system of claim 1 wherein the derivative of the drain current is a derivative with respect to the transistor length.

5. The semiconductor device modeling system of claim 1 wherein the training data further comprises a temperature;
wherein the derivative of the drain current is a derivative with respect to the temperature.

6. The semiconductor device modeling system of claim 1 wherein the target transformer converts the training data that represents the drain current into a logarithm of a derivative of the drain current;
wherein the logarithm of the derivative of the drain current is the transformed drain current value that is a training target of the deep neural network that is evaluated by the loss function generator.

7. The semiconductor device modeling system of claim 1 wherein the final set of the weights is applied to the deep neural network during simulation when simulated training data representing simulated voltages are applied and pre-processed by the input pre-processor and operated upon by the deep neural network using the final set of weights to generate a simulated output;
a reversed target transformer that receives the simulated output from the deep neural network during simulation, and generates a simulated value of the drain current, the reversed target transformer performing an operation that is a reverse of a transform performed by the target transformer;
whereby the simulated value of the drain current is generated from the deep neural network using the final set of the weights.

8. The semiconductor device modeling system of claim 7 wherein the reversed target transformer comprises an integrator that integrates the simulated output from the deep neural network over a range of voltages to generate the simulated value of the drain current.

9. The semiconductor device modeling system of claim 1 wherein the input pre-processor generates a logarithm of the gate voltage or a logarithm of the drain voltage as the pre-processed training data applied to the deep neural network input,
whereby logarithmic voltage inputs are applied to the deep neural network.

10. The semiconductor device modeling system of claim 1 wherein the input pre-processor performs a Principal Component Analysis (PCA) of the training data to select principal data, wherein the principal data is the pre-processed training data applied to the deep neural network input,
whereby a PCA is performed before inputs are applied to the deep neural network.

11. A computer-implemented process to simulate a simulated transistor comprising:
receiving input data that represents a gate voltage and a drain voltage applied to the simulated transistor by a circuit simulator, the input data also including a transistor width and a transistor length of the simulated transistor;

pre-processing the input data by generating a logarithm of the gate voltage or by generating a logarithm of the drain voltage to generate pre-processed input data;

applying the pre-processed input data as inputs to a deep neural network;

applying a model set of weights to the deep neural network and operating the deep neural network upon the pre-processed input data to generate a neural network output;

integrating the neural network output over a range of gate voltages or over a range of drain voltages to generate a drain current value for the simulated transistor;

outputting the drain current value to the circuit simulator, the circuit simulator using the drain current value to simulate operation of the simulated transistor in a circuit, wherein the deep neural network receives a logarithmic voltage and generates a derivative of the drain current value during simulation.

12. The computer-implemented process of claim 11 wherein the deep neural network has at least seven intermediate layers and wherein the deep neural network has at least ten thousand weights.

13. The computer-implemented process of claim 11 wherein the neural network output is a conductance value.

14. The computer-implemented process of claim 11 wherein the neural network output is a transconductance value.

15. A non-transitory computer-readable medium tor storing computer-executable instructions, the computer-executable instructions when executed by a processor implementing a method comprising:

applying initial weights to connections between nodes in a neural network, a weight specifying a strength of a connection between nodes in the neural network;

receiving input data that represents a gate voltage and a drain voltage applied to a test transistor, the input data also including a transistor width and a transistor length oi the test transistor;

pre-processing the input data to generate pre-processed input data;

executing training routines that apply the pre-processed training data to inputs of the neural network;

receiving target data that represents a drain current measured on the test transistor when the gate voltage and the drain voltage are also applied to the test transistor during testing;

transforming the target data into transformed target data;

generating a loss function from a comparison of the transformed target data to an output of the neural network when the pre-processed training data is applied to inputs of the neural network by the training routines;

using the loss function to adjust the initial weights to generate updated weights;

applying the updated weights to the neural network and performing additional iterations that update the updated weights when a target endpoint has not been reached; and when the target endpoint has been reached, outputting the neural network with the updated weights as a model of the test transistor;

wherein pre-processing the input data to generate pre-processed input data further comprises generating a logarithm of the gate voltage or generating a logarithm of the drain voltage, wherein logarithms of voltages are applied as inputs of the neural network.

16. The non-transitory computer-readable medium of claim 15 wherein transforming the target data into transformed target data further comprises:

generating a derivative of the drain current as the transformed target data.

17. A non-transitory computer-readable medium for storing computer-executable instructions, the computer-executable instructions when executed by a processor implementing a method comprising:

applying initial weights to connections between nodes in a neural network, a weight specifying a strength of a connection between nodes in the neural network;

receiving input data that represents a gate voltage and a drain voltage applied to a test transistor, the input data also including a transistor width and a transistor length of the test transistor;

pre-processing the input data to generate pre-processed input data;

executing training routines that apply the pre-processed training data to inputs of the neural network;

receiving target data that represents a drain current measured on the test transistor when the gate voltage and the drain voltage are also applied to the test transistor during testing;

transforming the target data into transformed target data;

generating a loss function from a comparison of the transformed target data to an output of the neural network when the pre-processed training data is applied to inputs of the neural network by the training routines;

using the loss function to adjust the initial weights to generate updated weights;

applying the updated weights to the neural network and performing additional iterations that update the updated weights when a target endpoint has not been reached; and when the target endpoint has been reached, outputting the neural network with the updated weights as a model of the test transistor;

wherein transforming the target data into transformed target data further comprises:

generating a logarithm of a derivative of the drain current as the transformed target data.

18. A non-transitory computer-readable medium tor storing computer-executable instructions, the computer-executable instructions when executed by a processor implementing a method comprising:

applying initial weights to connections between nodes in a neural network, a weight specifying a strength of a connection between nodes in the neural network;

receiving input data that represents a gate voltage and a drain voltage applied to a test transistor, the input data also including a transistor width and a transistor length of the test transistor;

pre-processing the input data to generate pre-processed input data;

executing training routines that apply the pre-processed training data to inputs of the neural network;

receiving target data that represents a drain current measured on the test transistor when the gate voltage and the drain voltage are also applied to the test transistor during testing;

transforming the target data into transformed target data;
generating a loss function from a comparison of the transformed target data to an output of the neural network when the pre-processed training data is applied to inputs of the neural network by the training routines;
using the loss function to adjust the initial weights to generate updated weights;
applying the updated weights to the neural network and performing additional iterations that update the updated weights when a target endpoint has not been reached; and
when the target endpoint has been reached, outputting the neural network with the updated weights as a model of the test transistor;
after the target endpoint has been reached:
applying the updated weights to the neural network;
receiving input data that represents a gate voltage and a drain voltage applied to a simulated transistor, the input data also including a transistor width and a transistor length of the simulated transistor,
pre-processing the input data to generate pre-processed input data;
inputting the pre-processed input data to the neural network and using the neural network with the updated weights to operate upon the pre-processed input data to generate a neural network output; and
integrating the neural network output to generate a simulated drain current for the simulated transistor.

* * * * *